US006771193B2

United States Patent
Craft

(10) Patent No.: US 6,771,193 B2
(45) Date of Patent: Aug. 3, 2004

(54) SYSTEM AND METHODS FOR EMBEDDING ADDITIONAL DATA IN COMPRESSED DATA STREAMS

(75) Inventor: David John Craft, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/226,963

(22) Filed: Aug. 22, 2002

(65) Prior Publication Data

US 2004/0036633 A1 Feb. 26, 2004

(51) Int. Cl.[7] .................................................. H03M 7/40
(52) U.S. Cl. .......................................... 341/67; 341/51
(58) Field of Search ........................... 341/67, 106, 51, 341/50–107

(56) References Cited

U.S. PATENT DOCUMENTS

| | | | |
|---|---|---|---|
| 5,200,962 A | | 4/1993 | Kao et al. |
| 5,388,158 A | | 2/1995 | Berson |
| 5,612,693 A | | 3/1997 | Craft et al. |
| 5,652,878 A | | 7/1997 | Craft |
| 5,661,024 A | | 8/1997 | Kao et al. |
| 5,689,587 A | | 11/1997 | Bender et al. |
| 5,694,125 A | * | 12/1997 | Owsley et al. ............... 341/50 |
| 5,696,507 A | * | 12/1997 | Nam .......................... 341/67 |
| 5,721,788 A | | 2/1998 | Powell et al. |
| 5,745,606 A | | 4/1998 | Yoshimichi |
| 5,822,430 A | * | 10/1998 | Doud ......................... 380/260 |
| 5,877,711 A | | 3/1999 | Craft |
| 6,005,643 A | | 12/1999 | Morimoto et al. |

(List continued on next page.)

OTHER PUBLICATIONS

Kaklamanis, et al.; "A Hypercube Algorithm for sliding Window Compression"; *Parallel Processing Letters*; World Scientific Publishing Company; 2000; vol. 10, No. 4; Abstract; Computer Technology Institute and Dept. of Computer Engineering and Informatics, University of Patras; 26500 Rio, Greece.

(List continued on next page.)

*Primary Examiner*—Michael Tokar
*Assistant Examiner*—Linh V Nguyen
(74) *Attorney, Agent, or Firm*—Carr LLP; Robert M. Carwell

(57) ABSTRACT

An encoder for compressing data is described, including a history buffer having multiple storage locations for storing target data units. The encoder is configured to input a target data string including multiple target data units, and additional data (e.g., security data associated with the target data string). In the event the history buffer contains multiple matching strings that match the target data string, the encoder is configured to select a displacement value of one of the matching strings dependent on a portion of the additional data, and to produce a copy pointer corresponding to the target data string and including the selected displacement. The selected displacement value in the copy pointer conveys the portion of the additional data. A decoder for decompressing data is also described, including a history buffer having multiple storage locations for storing data units. The decoder is configured to input a copy pointer including a displacement value indicative of a location of a first data unit of a data string in the history buffer, to use the displacement value to determine the data string, and to use the displacement value to determine a value of a quantity of additional data conveyed by the displacement value in the event multiple copies of the data string exist in the history buffer. A system is described including the encoder and the decoder, as are methods for compressing and decompressing data.

24 Claims, 7 Drawing Sheets

U.S. PATENT DOCUMENTS

| | | | |
|---|---|---|---|
| 6,069,575 A | * | 5/2000 | Kinouchi et al. ............. 341/67 |
| 6,091,777 A | | 7/2000 | Guetz et al. |
| 6,218,970 B1 | | 4/2001 | Jaquette |
| 6,219,457 B1 | * | 4/2001 | Potu ........................... 382/246 |
| 6,256,653 B1 | * | 7/2001 | Juffa et al. ................. 708/290 |
| 6,275,599 B1 | | 8/2001 | Adler et al. |
| 6,285,775 B1 | | 9/2001 | Wu et al. |
| 6,311,258 B1 | * | 10/2001 | Gibson et al. ............. 711/200 |
| 6,320,986 B1 | | 11/2001 | Strohacker |
| 6,552,673 B2 | * | 4/2003 | Webb .......................... 341/67 |
| 6,603,413 B2 | * | 8/2003 | Igarashi et al. .............. 341/67 |

OTHER PUBLICATIONS

Ziv, et al; "A Universal Algorithm for Sequential Data Compression"; *IEEE Trans. Inform. Theory*; May 1997; vol. IT–23, No. 3; pp. 337–343.

* cited by examiner

US 6,771,193 B2

SYSTEM AND METHODS FOR EMBEDDING ADDITIONAL DATA IN COMPRESSED DATA STREAMS

TECHNICAL FIELD

This invention relates generally to data encoding and decoding techniques, and, more particularly, to systems and methods for performing data compression and decompression.

BACKGROUND OF THE INVENTION

Data compression generally involves converting data to a format that requires fewer data units (e.g., bits). Data compression is widely used to compress various types of computer files. For example, ARC and ZIP are two popular file compression formats. Data compression is also used in backup utilities, spreadsheet applications, and database management systems.

Data compression is particularly useful in communications because it enables devices to transmit the same amount of information using fewer data units. For example, common facsimile (fax) machines translate pictures and text into bitmaps, and transmit the bitmaps via standard telephone lines. The CCITT (Comité Consultatif International Téléphonique et Télégraphique), an organization that sets international communications standards, has defined the data compression technique used for transmitting faxes (the Group 3 standard CCITT T.4). The CCITT has also defined several data compression standards for data communications via modems, including the CCITT V.42bis standard, a data compression protocol that enables modems to achieve a data transfer rate of 34,000 bits per second.

In 1977, Abraham Lempel and Jacob Ziv proposed a class of data compression algorithms called the Lempel-Ziv 1 (LZ_1) class. (See "A Universal Algorithm for Sequential Data Compression" by J. Ziv and A. Lempel, *IEEE Trans. Inform. Theory*, Vol. IT-23, No. 3, pp. 337–343, 1977). The LZ_1 class of compression algorithms is widely used for data such as executable program instructions (i.e., code) modules, electronic documents, financial data, and other types of data in situations where the original information must be recovered exactly.

In general, LZ_1 algorithms achieve compression by building and maintaining a data structure called a history buffer. An encoder implements an LZ_1 encoding or compression process, and a decoder implements an LZ_1 decoding or decompression process. The encoder and the decoder each have substantially identical history buffers. The history buffers are first initialized to the same known state (e.g., a cleared empty state), then updated in a similar fashion. The encoder receives an input data stream for compression, and uses the input data stream to update the encoder history buffer. The decoder generates an identical data stream as output, and also uses this output data stream to update the decoder history buffer. As a result, the contents of the two history buffers again become identical.

As the encoder history buffer fills, it becomes increasingly possible for the encoder to represent incoming data by encoding reference information identifying a sequence of data (i.e., a "matching string") already present in the encoder history buffer. In general, the encoder attempts to find the longest possible sequences of data (i.e., matching strings) stored in the encoder history buffer. When the reference information can be encoded in fewer bits of information than the data string it identifies, compression is achieved. This is the principal mechanism by which LZ_1 algorithms achieve compression.

An LZ_1 encoder typically processes incoming data one byte at a time, and copies each byte into the encoder history buffer as it is encoded. When the encoder history buffer is full, the next input data byte typically displaces (i.e., overwrites) the oldest data byte in the encoder history buffer. The encoder history buffer may thus be thought of as a "sliding window" passing through the input data stream. For this reason, the LZ_1 class of data compression algorithms is sometimes referred to as "sliding window" data compression.

Detailed encoding strategies vary, but in general, if the input data matches a 2-byte or longer string found in the encoder history buffer, the encoder will encode the input as a "copy pointer." Typically, a copy pointer includes a leading '1' identifier bit, followed by a count field indicating the length of the data match, followed by a displacement field indicating the current location of the string in the encoder history buffer.

If an input data byte does not match a data byte in the encoder history buffer, the encoder encodes the data byte as a literal. A literal typically includes a leading '0' identifier bit, followed by the data (e.g., 8 bits of a data byte). When a given input data byte matches a data byte in the encoder history buffer, but the next input data byte does not match the next data byte in the encoder history buffer, the encoder also encodes the given input data byte as a literal.

The compressed data stream produced by the encoder thus includes an arbitrary sequence of literals and copy pointers, distinguished by their respective identifier bits. An LZ_1 decoder receives a compressed data stream produced by an encoder. The decoder typically decodes literals by simply removing the leading "0" bit, producing the data as output, and storing a copy of the data in the decoder history buffer. The decoder decodes copy pointers by extracting a count value from the count field and a displacement value from the displacement field. The decoder uses the count value and the displacement value to identify the corresponding string in the decoder history buffer. The decoder copies the corresponding string from the decoder history buffer to the output, and also stores the corresponding string byte sequentially in the decoder history buffer, so when the operation is complete the history buffers are in step once more.

The Adaptive Lossless Data Compression (ALDC) data compression algorithm is one variant of the LZ_1 class of data compression algorithms. The ALDC algorithm is an internationally accepted ANSI (American National Standards Institute), ECMA (formerly known as the European Computer Manufacturers Association), and QIC (Quarter-Inch Cartridge Drive Standards, Inc.) standard. (See, for example, standard QIC-154, "Adaptive Lossless Data Compression (ALDC)", currently available on the World Wide Web at www.qic.org).

The ALDC algorithm uses a variable-length count field. For example, a 2-bit count field can indicate matching data string lengths of 2 or 3 bytes. A binary displacement field is used to encode the displacement value, 10 bits being needed for a 1024-byte history buffer size. Encoding a 2-byte (16 bit) matching string using a 13-bit copy pointer (with a leading '1' bit, a 2-bit count filed, and a 10-bit displacement field) achieves a compression of 16/13 to 1. Encoding a 3-byte (24 bit) matching string using the 13-bit copy pointer compresses 24/13 to 1. Encoding longer strings requires larger count fields, but even so, such encodings are capable of producing even greater compressions.

SUMMARY OF THE INVENTION

An encoder for compressing data is described, including a history buffer having multiple storage locations for storing target data units. The encoder is configured to input a target data string including multiple target data units, and additional data (e.g., security data associated with the target data string). In the event the history buffer contains multiple matching strings that match the target data string, the encoder is configured to select a displacement value of one of the matching strings dependent on a portion of the additional data to be included, and to produce a copy pointer corresponding to the target data string and including the selected displacement such that the selected displacement value in the copy pointer conveys the portion of the additional data.

A decoder for decompressing data is also described, including a history buffer having multiple storage locations for storing data units. The decoder is configured to input a copy pointer including a displacement value indicative of a location of a first data unit of a data string in the history buffer, to use the displacement value to determine the data string, and to use the displacement value to determine a value of a quantity of additional data conveyed by the displacement value in the event multiple copies of the data string exist in the history buffer. A system is described including the encoder and the decoder.

A method for compressing data is described including inputting a target data string including multiple target data units, and additional data. The following are performed in the event multiple matching strings of data units stored in a history buffer match the target data string: selecting a displacement value of one of the multiple matching strings dependent on a portion of the additional data, and producing a copy pointer corresponding to the target data string and including the selected displacement value such that the displacement value conveys the portion of the additional data.

A method for decompressing data is described including inputting a copy pointer having a displacement value indicative of a location of a first data unit of a data string in a history buffer. The displacement value is used to determine the data string. In the event multiple copies of the data string exist in the history buffer, the displacement value is used to determine a value of a quantity of additional data conveyed by the displacement value.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
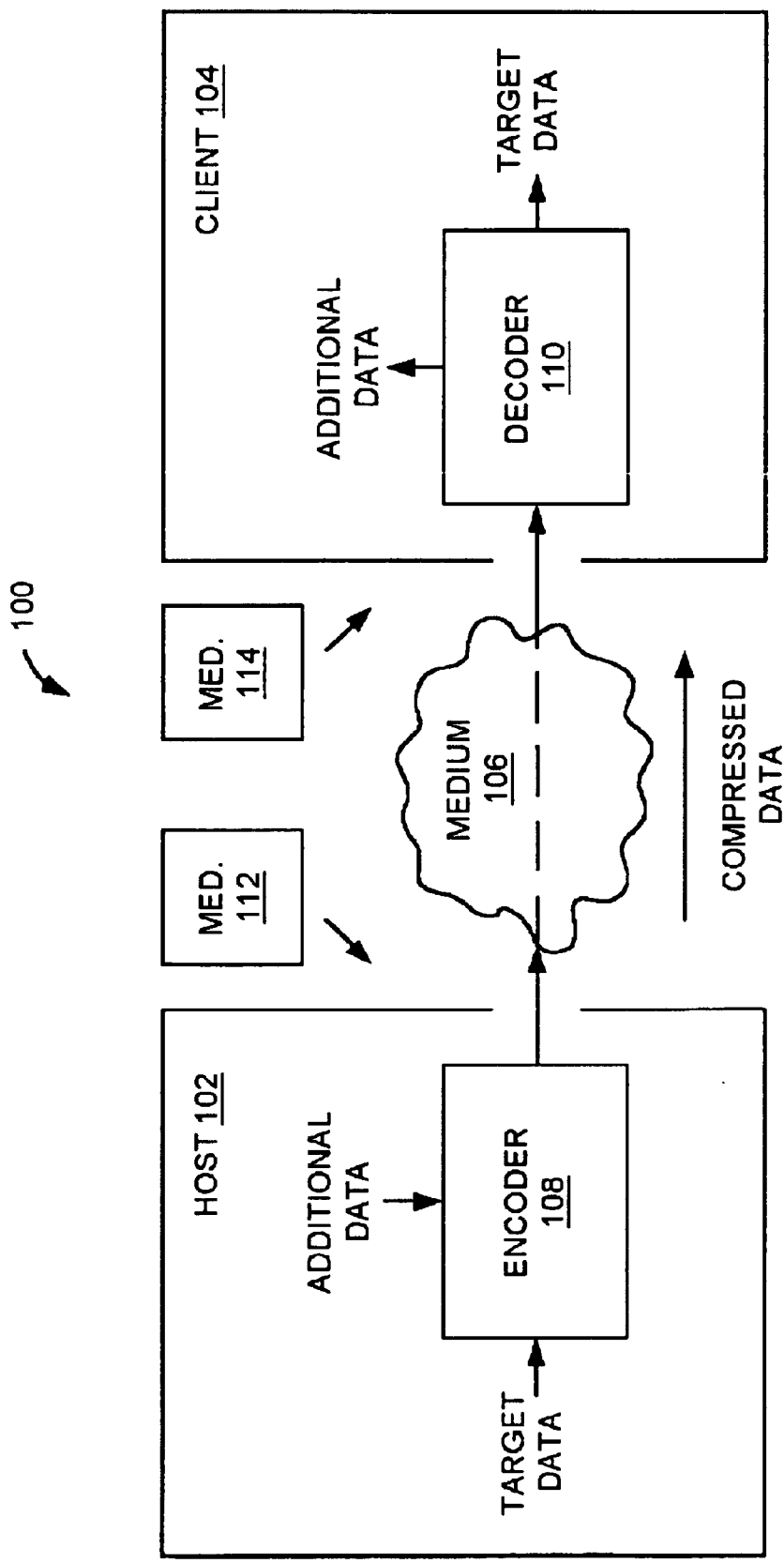
FIG. 1 is a diagram of one embodiment of a computer system including a host coupled to a client via a medium, wherein the host includes an encoder and the client includes a decoder.

FIG. 1 is a diagram of one embodiment of a computer system 100 including a host 102 coupled to a client 104 via a medium 106. The host 102 transmits compressed data to the client 104 via the medium 106. As used herein, the term "data" refers to information suitable for processing by a computer system, and includes software program instructions (i.e., code). The host 102 includes an encoder 108 that fetches or receives (i.e., inputs) "target" data, and performs a data compression encoding algorithm on (i.e., "compresses") the target data to produce the compressed data. The target data may be contained within, for example, a file such as a document file, an image file, a software program file, and the like. In general, the compressed data produced by the encoder 108 occupies less space (e.g., includes fewer bits) than the target data input by the encoder 108. The client 104 includes a decoder 110 that receives the compressed data, and performs a data decompression decoding algorithm on (i.e., "decompresses") the compressed data to produce an exact copy of the target data input by the encoder 108.

As indicated in FIG. 1 and described in detail below, the encoder 108 of the host 102 also fetches or receives (i.e., inputs) "additional" data, and uses the additional data to produce the compressed data such that the compressed data also conveys the additional data. The additional data may be, for example, security data associated with the target data (and/or subsequently transmitted target data) such as authentication information, encryption/decryption keys, and the like. The decoder 110 of the client 104 uses the compressed data to produce the additional data in addition to the target data as illustrated in FIG. 1.

The host 102 and the client 104 include hardware and/or software for transmitting and receiving signals used to covey the compressed data. For example, the host 102 and the client 104 may communicate via electrical signals. In this case, the medium 106 may include one or more wires or electrical cables for conveying the electrical signals. The host 102 and the client 104 may each include a network interface card (NIC) or a modulator-demodulator (modem) for generating the electrical signals, driving the electrical signals on the one or more wires or electrical cables, and/or receiving electrical signals from the one or more wires or electrical cables. The medium 106 may include, for example, the public switched telephone network (PSTN) and/or the Internet.

Alternately, the host 102 and the client 104 may communicate via optical signals, and the medium 106 may include one or more optical cables. Further, the host 102 and the client 104 may communicate via electromagnetic signals (e.g., radio waves), and the medium 106 may include air.

It is noted that the encoder 108 of the host 102 may be embodied within hardware and/or software. A carrier medium 112 may be used to convey software embodying the functions of the encoder 108 to the host 102. For example, the host 102 may include a disk drive for receiving removable disks (e.g., a floppy disk drive, a compact disk read only memory or CD-ROM drive, and the like), and the carrier medium 112 may be a disk (e.g., a floppy disk, a CD-ROM disk, and the like) embodying software (e.g., computer program code) for receiving target data and performing a data compression encoding algorithm on (i.e., "compressing") the target data to produce the compressed data.

Similarly, the decoder 110 of the client 104 may be embodied within hardware and/or software. A carrier medium 114 may be used to convey software embodying the functions of the decoder 110 to the client 104. For example, the client 104 may include a disk drive for receiving removable disks (e.g., a floppy disk drive, a compact disk read only memory or CD-ROM drive, and the like), and the carrier medium 114 may be a disk (e.g., a floppy disk, a CD-ROM disk, and the like) embodying software (e.g., computer program code) for receiving the compressed data produced by the host 102 and performing a data decompression decoding algorithm on (i.e., "decompressing") the compressed data to produce an exact copy of the target data input by the encoder 108 of the host 102.

Figure 2:
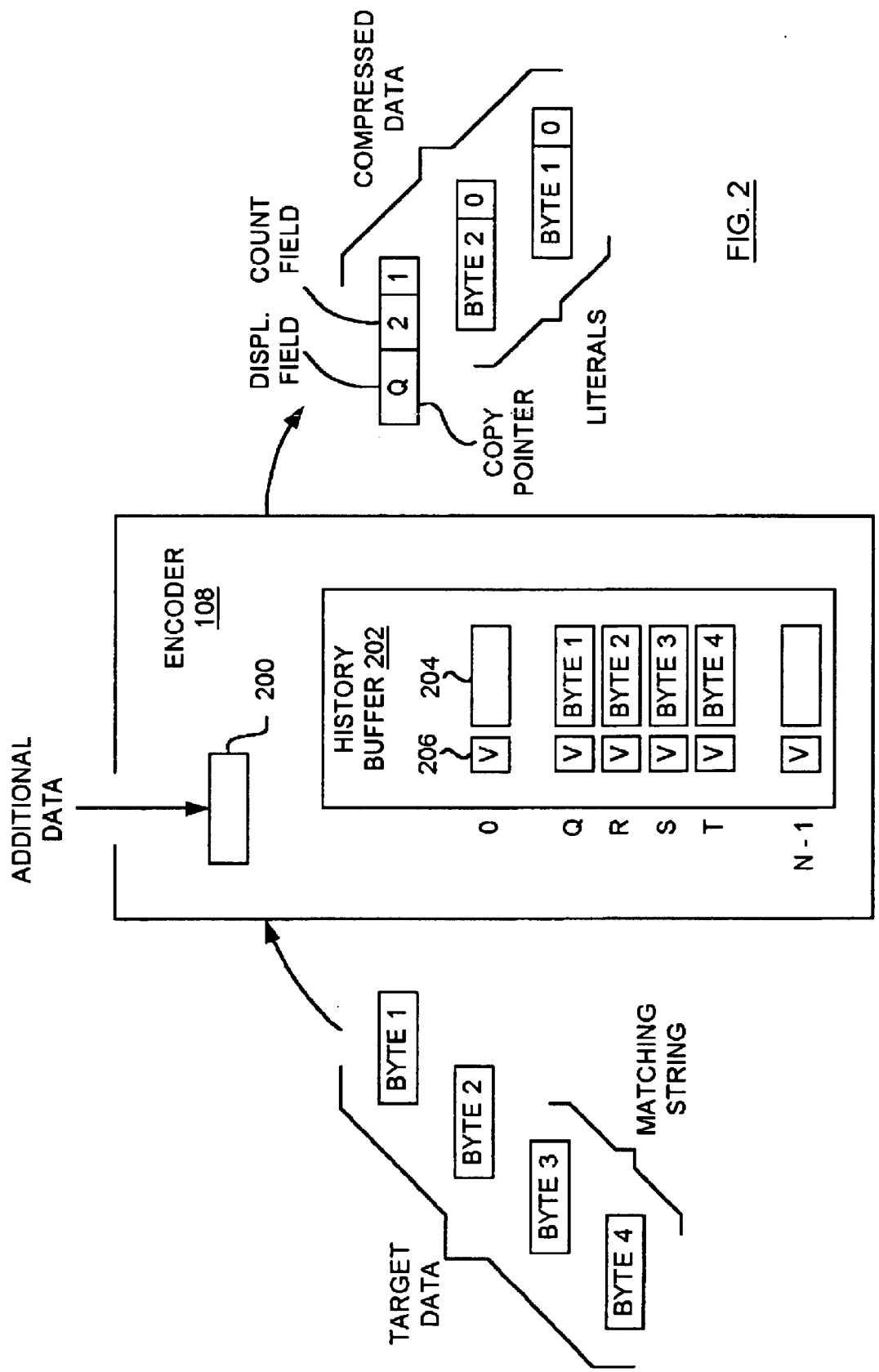
FIG. 2 is a diagram of one embodiment of the encoder of FIG. 1, wherein the encoder fetches or receives (i.e., inputs) target data as a serial byte stream, and compresses the target data to produce a compressed data stream.

FIG. 2 is a diagram of one embodiment of the encoder 108 of FIG. 1. In the embodiment of FIG. 2, the encoder 108 fetches or receives (i.e., inputs) the target data as a serial byte stream, and compresses the target data to produce a compressed data stream. The encoder 108 may, for example, implement a lossless data compression algorithm of the LZ_1 type (e.g., an ALDC data compression algorithm).

As indicated in FIG. 2, the encoder 108 also fetches or receives (i.e., inputs) additional data, and uses the additional data to produce the compressed data such that the compressed data also conveys the additional data. The additional data may be, for example, security data associated with the target data (and/or subsequently transmitted target data) such as authentication information, encryption/decryption keys, and the like. The encoder 108 stores the additional data in a storage element 200 (e.g., a register).

The encoder 108 includes a history buffer 202 having 'N' storage locations numbered 0 through 'N−1'. To facilitate storing and searching operations, each storage location of the history buffer 202 has a corresponding valid bit used to indicate whether the contents of the storage location are valid. The storage location '0' of the history buffer 202 is labeled 204, and a valid bit 206 corresponds to the storage location '0'.

The encoder 108 processes the target data serially, one byte at a time. Each byte of the target data is copied into the history buffer 202 as it is encoded, and stored in ascending storage location sequence in the history buffer 202 (per the ALDC standard QIC-154). When the history buffer 202 is full, the next input target data byte displaces the target data byte that has been in the history buffer 202 the longest (i.e., the oldest target data byte). For example, when all of the 'N' storage locations of the history buffer 202 have been filled, the next target data byte is stored in storage location '0' of the history buffer 202 such that the oldest target data byte in the history buffer 202 is overwritten by the newest target data byte.

In FIG. 2, a target data stream includes 4 input data bytes labeled BYTE 1, BYTE 2, BYTE 3, and BYTE 4. In the embodiment of FIG. 2, the encoder 108 fetches or receives (i.e., inputs) BYTE 1, stores BYTE 1 in a storage location 'Q' of the history buffer 202, changes a value of the valid bit corresponding to the storage location 'Q' to indicate that the contents of the storage location 'Q' is valid, and produces a literal having a first or "leading" bit '0' followed by the contents of BYTE 1.

The encoder 108 then inputs BYTE 2 which differs from BYTE 1. The encoder 108 searches the valid storage locations of the history buffer 202 for a match. In this example the encoder 108 finds no match for BYTE 2 in the valid storage locations of the history buffer 202. The encoder 108 stores BYTE 2 in the storage location 'R' of the history buffer 202, changes a value of the valid bit corresponding to the storage location 'R' to indicate that the contents of the storage location 'R' is valid, and produces another literal having a leading bit '0' and the contents of BYTE 2.

The encoder 108 then inputs BYTE 3, which is equal to (i.e., has a value equal to) BYTE 1. The encoder 108 searches the valid storage locations of the history buffer 202 for a match for BYTE 3. In the example of FIG. 2, the encoder 108 finds only one match for BYTE 3 in the history buffer 202, stored in the storage location 'Q' (BYTE 1). The encoder 108 saves a displacement value of BYTE 1 in the history buffer 202, and sets a count value equal to 1. In general, the displacement value of BYTE 1 indicates a location of the storage location number 'Q' in the history buffer 202. In the embodiment of FIG. 2, the displacement value is the number of the storage location in the history buffer 202—the number 'Q' itself. In other embodiments, the displacement value may be, for example, an address of the storage location 'Q' in the history buffer 202. The encoder 108 stores BYTE 3 in the storage location 'S' of the history buffer 202, and changes a value of the valid bit corresponding to the storage location 'S' to indicate that the contents of the storage location 'S' is valid.

The encoder 108 then inputs BYTE 4, which is equal to BYTE 2. The encoder 108 uses the saved displacement value to check the storage location 'R' (containing BYTE 2) for a match for BYTE 4. A match for BYTE 4 is found in the storage location 'R' (BYTE 2), and the encoder 108 increments the count value. The encoder 108 stores BYTE 4 in the storage location 'T', and changes a value of the valid bit corresponding to the storage location 'T' to indicate that the contents of the storage location 'T' is valid.

In the example of FIG. 2, BYTE 1 and BYTE 2, stored in the history buffer 202, form a 2-byte matching string that matches a target data string including BYTE 3 and BYTE 4. During the processing of a target data byte following BYTE 4, the encoder 108 produces a copy pointer having a leading bit '1', a count field, and a displacement field. In general, the count field contains a count value indicating a number of bytes in a matching string, and the displacement field contains a displacement value indicating a location (e.g., an address or storage location number) of a first byte of the matching string in the history buffer 202. In the example of FIG. 2, the count field contains a count value of '2' as the matching string including BYTE 1 and BYTE 2 matches the target data string including BYTE 3 and BYTE 4. The displacement field contains a displacement value of 'Q' as BYTE 1, the first byte of the matching string, is located in location 'Q' of the history buffer 202.

Figure 3:
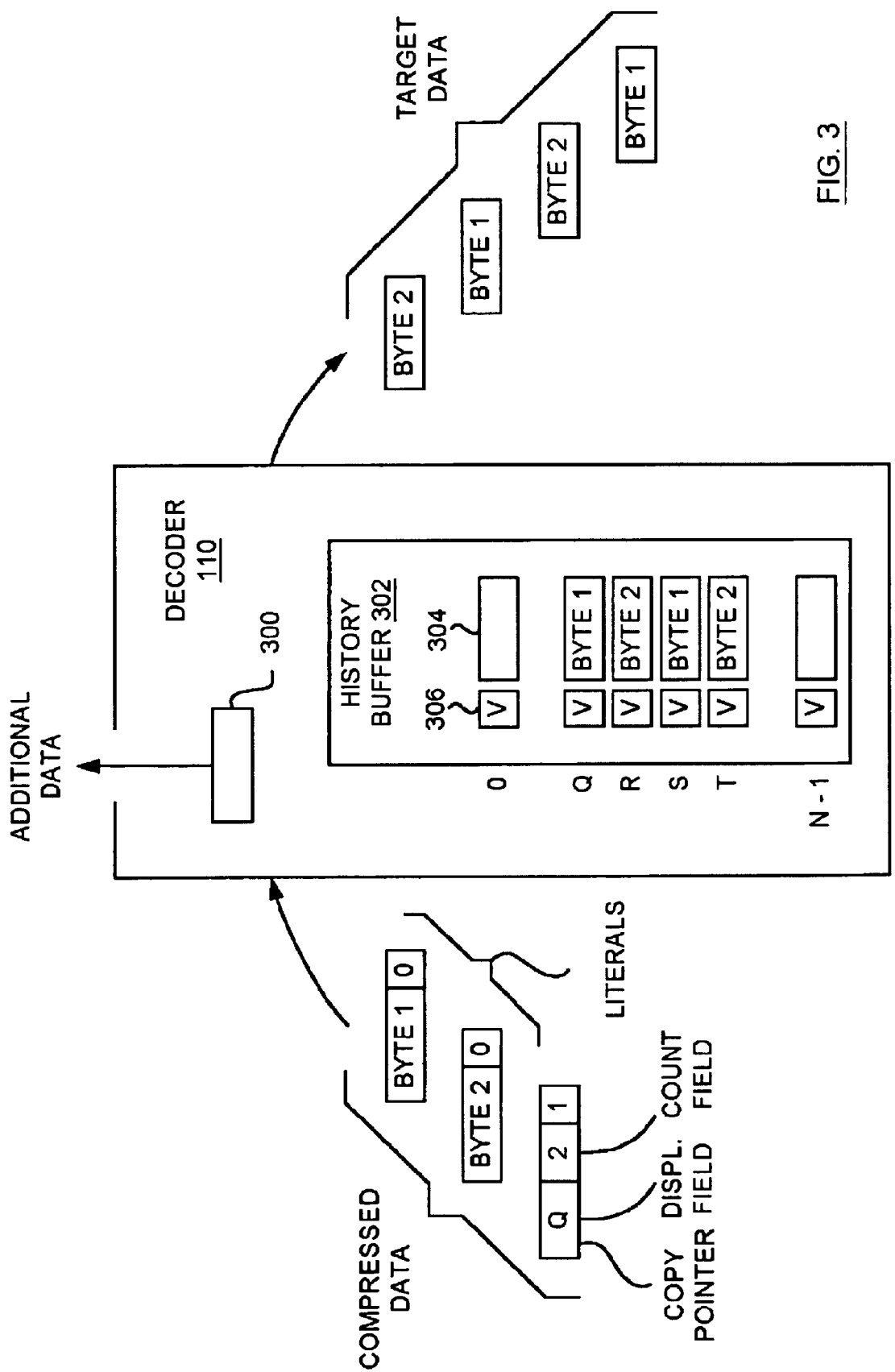
FIG. 3 is a diagram of one embodiment of the decoder of FIG. 1, wherein the decoder inputs the compressed data stream produced by the encoder of FIG. 2, and decompresses the compressed data stream to produce the target data as a serial byte stream.

FIG. 3 is a diagram of one embodiment of the decoder 110 of FIG. 1. In the embodiment of FIG. 3, the decoder 110 inputs the compressed data stream produced by the encoder 108 of FIG. 2, and decompresses the compressed data stream to produce the target data as a serial byte stream. The target data produced by the decoder 110 is an exact copy of the target data input by the encoder 108 of FIG. 2. The decoder 110 may, for example, implement a lossless data decoding algorithm of the LZ_1 type (e.g., an ALDC data decoding algorithm).

As indicated in FIG. 3 and described in detail below, the decoder 110 also uses the compressed data to produce the additional data conveyed by the compressed data. In the embodiment of FIG. 3, the decoder 110 includes a storage element 300 for assembling the additional data. The decoder 110 includes a history buffer 302 substantially identical to the history buffer 202 of the encoder 108 of FIG. 2. Similarly to the history buffer 202 of the encoder 108 of FIG. 2, the history buffer 302 of the decoder 110 has 'N' locations numbered 0 through 'N−1" as indicated in FIG. 3. To facilitate storing and searching operations, each storage location of the history buffer 302 has a corresponding valid bit used to indicate whether the contents of the storage location are valid. In FIG. 3, the storage location '0' of the history buffer 302 is labeled 304, and a valid bit 306 corresponds to the storage location '0'.

As indicated in FIG. 3, the fetched or received (i.e., input) compressed data is processed by the decoder 110 serially, one data unit at a time, where the data units include literals and copy pointers. As the decoder 110 decodes the input data units to produce bytes of the target data, the decoder 110 copies the bytes of the target data into the history buffer 302. When the history buffer 302 is full, the most recently produced target data byte displaces the target data byte that has been in the history buffer 302 the longest (i.e., the oldest target data byte). For example, when all of the 'N' storage locations of the history buffer 302 have been filled, the next target data byte produced is stored in storage location '0' of the history buffer 302 such that the oldest target data byte in the history buffer 302 is overwritten by the newest target data byte.

In FIG. 3, the input compressed data stream to the decoder 110 includes the two literals corresponding to BYTE 1 and BYTE 2, and the copy pointer corresponding to BYTE 3 and BYTE 4. The decoder 110 inputs the first literal corresponding to BYTE 1, produces target data BYTE 1 as output, stores BYTE 1 in the storage location 'Q' of the history buffer 302, and changes a value of the valid bit corresponding to the storage location 'Q' to indicate that the contents of the storage location 'Q' is valid.

The decoder 110 then inputs the second literal corresponding to BYTE 2. The decoder 110 produces target data BYTE 2 as output, stores the contents of BYTE 2 in location 'R' of the history buffer 302, and changes a value of the valid bit corresponding to the storage location 'R' to indicate that the contents of the storage location 'R' is valid.

The decoder 110 then inputs the copy pointer corresponding to BYTE 3 and BYTE 4, which match BYTE 1 and BYTE 2, respectively. For reasons described below, and in contrast to a conventional decoder, the decoder 110 first searches the history buffer 302 for all other valid storage locations containing a matching string defined by the copy pointer. That is, the decoder 110 searches the history buffer 302 for other valid and consecutive storage locations storing the same values stored in storage locations 'Q' (BYTE 1) and 'R' (BYTE 2). In the example of FIG. 3, the decoder 110 finds no other valid storage locations storing the matching string defined by the copy pointer.

The decoder 110 uses the displacement value 'Q' in the displacement field of the copy pointer to access BYTE 1 in storage location 'Q' of the history buffer 302, and produces BYTE 1 as output. The decoder 110 stores the value of BYTE 1 in storage location 'S', and changes a value of the valid bit corresponding to the storage location 'S' to indicate that the contents of the storage location 'S' is valid.

The decoder 110 then uses the displacement value 'Q' in the displacement field of the copy pointer and the count value of '2' in the count field to access BYTE 2 in storage location 'R' of the history buffer 302, and produces BYTE 2 as output. The decoder 110 then stores the value of BYTE 2 in storage location 'T', and changes a value of the valid bit corresponding to the storage location 'T' to indicate that the contents of the storage location 'T' is valid.

The ALDC data compression algorithm specifies that in situations where multiple matching strings exist in a history buffer of an encoder implementing the ALDC data decoding algorithm, the encoder will use the lowest possible displacement value in the corresponding copy pointer. (See, for example, standard QIC-154, "Adaptive Lossless Data Compression (ALDC)", currently available on the World Wide Web at www.qic.org). However, a conventional decoder implementing the ALDC data decoding algorithm will produce the same result regardless of which of the multiple possible displacement values is used in the corresponding copy pointer.

Figure 4:
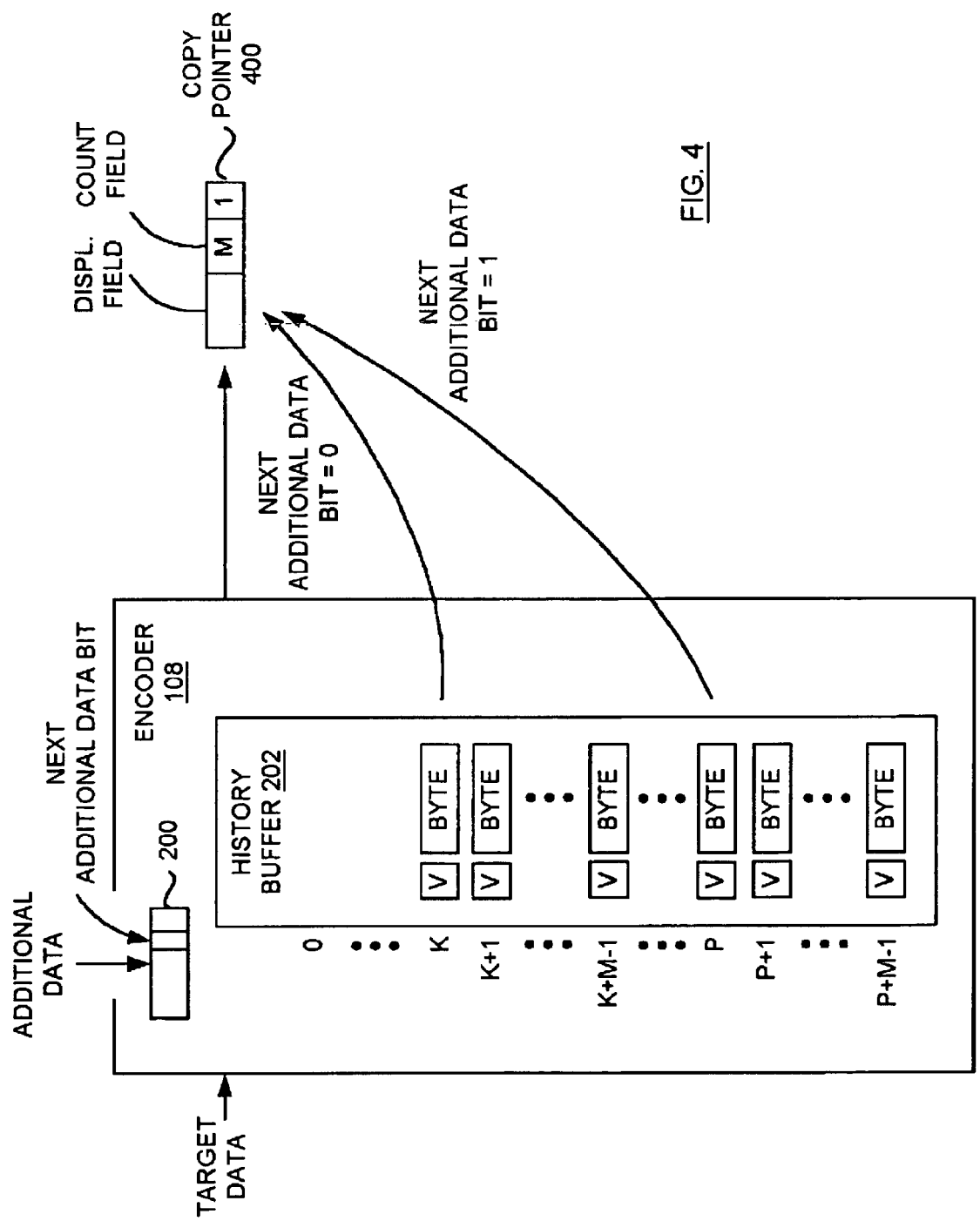
FIG. 4 is a diagram of the encoder of FIG. 2 illustrating encoder selection of one of multiple possible displacement values for a copy pointer produced by the encoder such that the selected displacement value conveys additional data.

FIG. 4 is a diagram of the encoder 108 of FIG. 2 illustrating how the encoder 108 selects one of multiple possible displacement values for a copy pointer 400 produced by the encoder 108 such that the selected displacement value conveys additional data. In FIG. 4, the encoder 108 has input 'M+1' target data bytes, where 'M'≧2. The history buffer 202 contains two matching strings for a target data string including the first 'M' of the 'M+1' bytes, and the encoder 108 has located the two 'M'-byte matching strings in the history buffer 202 (e.g., by searching the history buffer 202). A first matching string spans from storage location 'K' to storage location 'K+M−1', and the second matching string spans from storage location 'P' to storage location 'P+M−1'.

During the processing of target data byte 'M+1', the encoder 108 produces the copy pointer 400 shown in FIG. 4. The copy pointer 400 has a leading bit of '1', and a count field containing a count value of 'M'. The encoder 108 selects one of the two possible displacement values, corresponding to the two possible matching strings, dependent upon a value of a next bit of the additional data, and stores the selected displacement value in the displacement field of the copy pointer 400. The encoder 108 selects the displacement value of the matching string spanning from storage location 'K' to storage location 'K+M−1' if the next additional data bit has a value of '0', and the displacement value of the second matching string spanning from storage location 'P' to storage location 'P+M−1' if the next additional data bit has a value of '1'. As a result, the selected displacement value in the displacement field of the copy pointer 400 of the compressed data produced by the encoder 108 conveys the value of the next additional data bit.

In general, the encoder 108 selects a displacement value of one of multiple matching strings in the history buffer 202 dependent on a portion of the additional data such that the selected displacement value in the corresponding copy pointer conveys the portion of the additional data. Where the additional data is expressed as binary digits (bits), n possible matching strings and corresponding displacement values (n≧2) allows the next INT(log₂(n)) bits of the additional data to be conveyed, where INT0 is an integer function and INT(x) returns the largest integer less than or equal to x. Thus in the embodiment of FIG. 4 where the additional data is expressed as bits, and where n possible matching strings exist in the history buffer 202 (n≧2), the encoder 108 uses the next p=INT(log₂(n)) bits of the additional data to select one of $2^p$ possible displacement values corresponding to $2^p$ of the n possible matching strings such that the selected displacement value in the corresponding copy pointer conveys the next p bits of the additional data.

Figure 5:
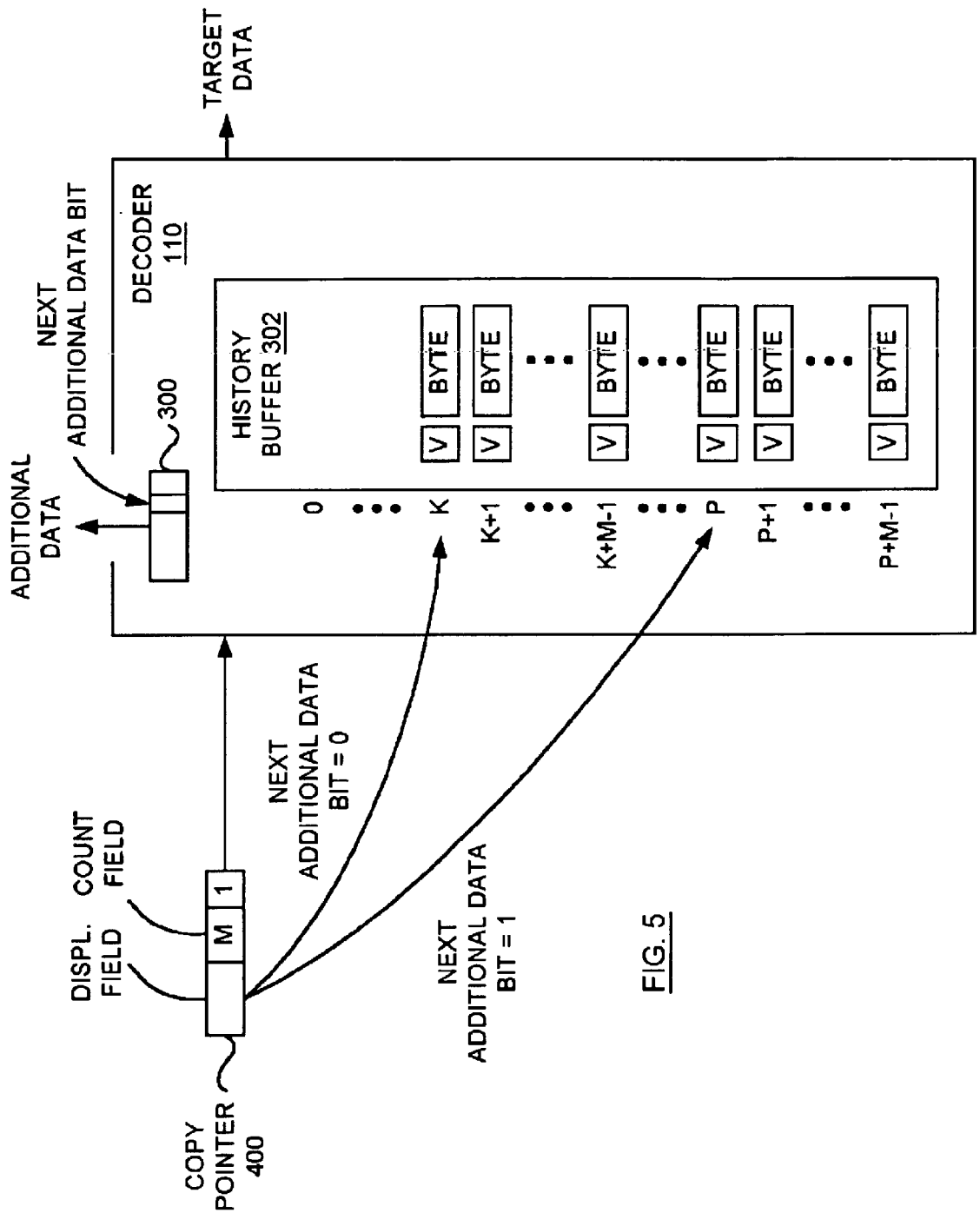
FIG. 5 is a diagram of the decoder of FIG. 3 illustrating decoder selection of one of the multiple possible displacement values in the input copy pointer of FIG. 4 to determine the additional data conveyed by the displacement value.

FIG. 5 is a diagram of the decoder 110 of FIG. 3 illustrating how the decoder 110 uses the selected one of the multiple possible displacement values in the input copy pointer 400 of FIG. 4 to determine the additional data conveyed by the displacement value. In FIG. 5, the decoder 110 has input the copy pointer 400, and has used the count value of 'M' and the displacement value to search the history buffer 302 (FIG. 3) for matching strings. The history buffer 302 contains two matching strings for the 'M' bytes, and the decoder 110 has located the two M-byte matching strings in the history buffer 302 (e.g., by searching the history buffer 302). A first matching string spans from storage location 'K' to storage location 'K+M−1', and the second matching string spans from storage location 'P' to storage location 'P+M−1'.

In general, the decoder 110 uses the selected one of multiple possible displacement values to determine a portion of the additional data conveyed by the selected displacement value. In the embodiment of FIG. 5 where the additional data is expressed as bits, the decoder 110 uses a selected one of n possible matching strings and corresponding displacement values (n≧2) to determine the next INT(log₂(n)) bits of the additional data conveyed by the selected displacement value.

In the embodiment of FIG. 5, the two possible displacement values allow a single next bit of the additional data to be conveyed by the selected displacement value. If the displacement value in the displacement field of the copy pointer 400 of FIG. 4 is the lower displacement value ('K'), the decoder 110 determines that the next additional data bit has a value of '0' as indicated in FIG. 5. If the displacement value is the higher displacement value ('P'), the next additional data bit has a value of '1'.

In a more complex example than that of FIGS. 4 and 5, if the history buffer 202 (FIGS. 2 and 4) of the encoder 108 (FIGS. 1, 2 and 4) and the history buffer 302 (FIGS. 3 and 5) of the decoder 110 (FIGS. 1, 3 and 5) each have 512 storage locations, and displacement values are expressed as storage location numbers. If when producing a copy pointer, the encoder 108 finds matching strings starting at locations '27', '36', '95', '108' and '200' in the history buffer 202. Since there are 5 possible matching strings and corresponding possible displacement values for the corresponding copy pointer, the encoder 108 may convey the next INT(log₂ (5))=2 additional data bits via the selected displacement value. For example, the possible displacement values '27', '36', '95 and '108' may be used to represent the two-bit values '00', '01', '10' and '11' respectively. (In this example, the highest possible displacement value of '200' is ignored). If the next two bits of the additional data are '01', the encoder 108 selects the displacement value of '36' for the displacement value to be stored in the corresponding copy pointer in order to convey the next two bits of the additional data '01'. It is noted that other coding schemes are possible and contemplated.

When the decoder 110 (FIGS. 1, 3 and 5) inputs the copy pointer with the displacement value of '36', the decoder 110 searches the history buffer 302 (FIGS. 3 and 5), and finds the matching strings at locations '27', '36', '95', '108' and '200' within the history buffer 302. According to the above described additional data transmission protocol, shared by the encoder 108 (FIGS. 1, 2 and 4) and the decoder 110, the first four possible displacement values of '27', '36', '95' and '108' represent the two-bit values '00', '01', '10' and '11' respectively. As the selected displacement value is '36', the decoder 110 determines that the next two bits of the additional data are '01'.

In order to determine an amount of additional data that could be included in a compressed output, software ALDC/cLDC data compression evaluation code was modified to count multiple matching string situations when compressing files. The cLDC algorithm employs two cascaded pre/postprocessors, one designed to recode a run of identical byte values, the other to detect and recode Unicode-like data sequences. Unicode is an encoding system used by the Java language and other Web-based applications. For more information about the cLDC algorithm, see "A Fast Hardware Data Compression Algorithm And Some Algorithmic Extensions" by David J. Craft, *IBM Journal of Research and Development*, Vol. 42, No. 6, November 1998.

An additional data bit count variable was incremented by 1 bit when encoding a copy pointer when there were 2 or 3 matching strings in a history buffer, by 2 bits when there were 4–7 matching strings in the history buffer, by 3 bits when there were 8–15 matches, and so on. On completion of the compression operation, the value of the additional data bit count variable was printed, and indicates the amount of additional data that could be so included in a compressed output.

The modified evaluation code was tested on a number of files of different types of data to see how much additional data could be included in the compressed output. The tested files included RS/6000 executable code modules, PowerPC 40X embedded micro-code images, PowerPC 60X executable code images, Intel x86 executable code, and lastly some specialized graphics processing unit applet code examples. The latter files included very large amounts of all-zero data areas, and these were first removed, because it is unlikely valuable bandwidth would be wasted in downloading such large amounts of zero values to an actual client. Table 1 below lists the results for the specialized graphics processing unit applet code examples.

TABLE 1

File Results for Modified Data Compression Evaluation Code.

| File | Original | Less Zeros | Compressed | Ratio | Embedded (%) |
|---|---|---|---|---|---|
| NOISE1 | 124,478 | 390 | 323 | 1.21:1 | 59 (1.89) |
| NOISE2 | 94,058 | 664 | 479 | 1.39:1 | 74 (1.39) |
| NOISE3 | 122,294 | 1,224 | 616 | 1.99:1 | 89 (0.91) |
| NOISE4 | 123,650 | 2,552 | 825 | 3.09:1 | 125 (0.61) |
| PN_SUB | 78,673 | 7,056 | 3,154 | 2.24:1 | 560 (0.99) |
| XFORML | 113,457 | 820 | 738 | 1.11:1 | 241 (4.08) |
| ALL | | 12,706 | 6,043 | 2.10:1 | 1,169 (1.15) |

Some of the "Less-Zeros" files were too small to get optimal compression, but were all compressed using an IBM standard ALDC_1 encoder having a history buffer size of 512 bytes. The "Less Zeros" and "Compressed" columns give the input and compressed file sizes in bytes, the "Ratio" column gives the compression ratio from dividing the "Less Zeros" column by the "Compressed" column, and the "Embedded" column gives the possible additional embedded information count in bits, along with a percentage of the "Less Zeros" file size. The "ALL" file is simply a concatenation of all the preceding "Less Zeros" files to get an overall figure for what might be a more typical broadband downloaded packet size. Additional test runs were performed on the other types of files, with similar results. The PowerPC 60X set of executables, for example, ranged from about 1.77:1 to about 2.15:1, with the embedded information between about 1.5% and 2.0% of the original file sizes.

In all cases, it was possible to embed at least 0.5% of the original uncompressed code size, and more typically over 1.0% of the above types of files. For a 16 kilobyte (KB) broadband data download packet size, 0.5% translates to 80 bytes, which is more than adequate to convey sufficient additional data to both provide an encryption/decryption key for the next packet and/or authentication information for the current packet.

Referring to FIGS. 1, 2, 3, 4 and 5, the history buffer 202 (FIGS. 2 and 4) of the encoder 108 (FIGS. 1, 2 and 4) and/or the history buffer 302 (FIGS. 3 and 5) of the decoder 110 (FIGS. 1, 3 and 5) may be implemented as a series of linked lists (e.g., up to 256 linked lists), one for each possible starting byte value. This history buffer implementation allows relatively fast searching for matching strings.

Referring back to FIG. 1, the computer system 100 may, for example, employ the above described data compression technique until a fixed amount of additional data is conveyed from the host 102 to the client 104. The additional data may be, for example, an encryption/decryption key, and/or authentication information, for a much larger data segment. For example, if the compressed data is packetized, and the packets are transmitted from the host 102 to the client 104 in groups (e.g., of 8 or 16 packets), only one packet of each group need convey additional data used to authenticate the group and/or supply an encryption/decryption key for the following packet group. An overall scheme or protocol stack may involve receiving a packet, and performing error checking and correction as necessary, including resend protocols and/or error correction codes. Once the received packet is considered error-free, a decryption algorithm may be applied to the received packet. A decompression step may then be performed on the received packet, with or without decoding of additional data. A higher-level security protocol may take care of authenticating the decompressed data, and/or changing encryption/decryption key(s) on a periodic basis.

Figure 6:
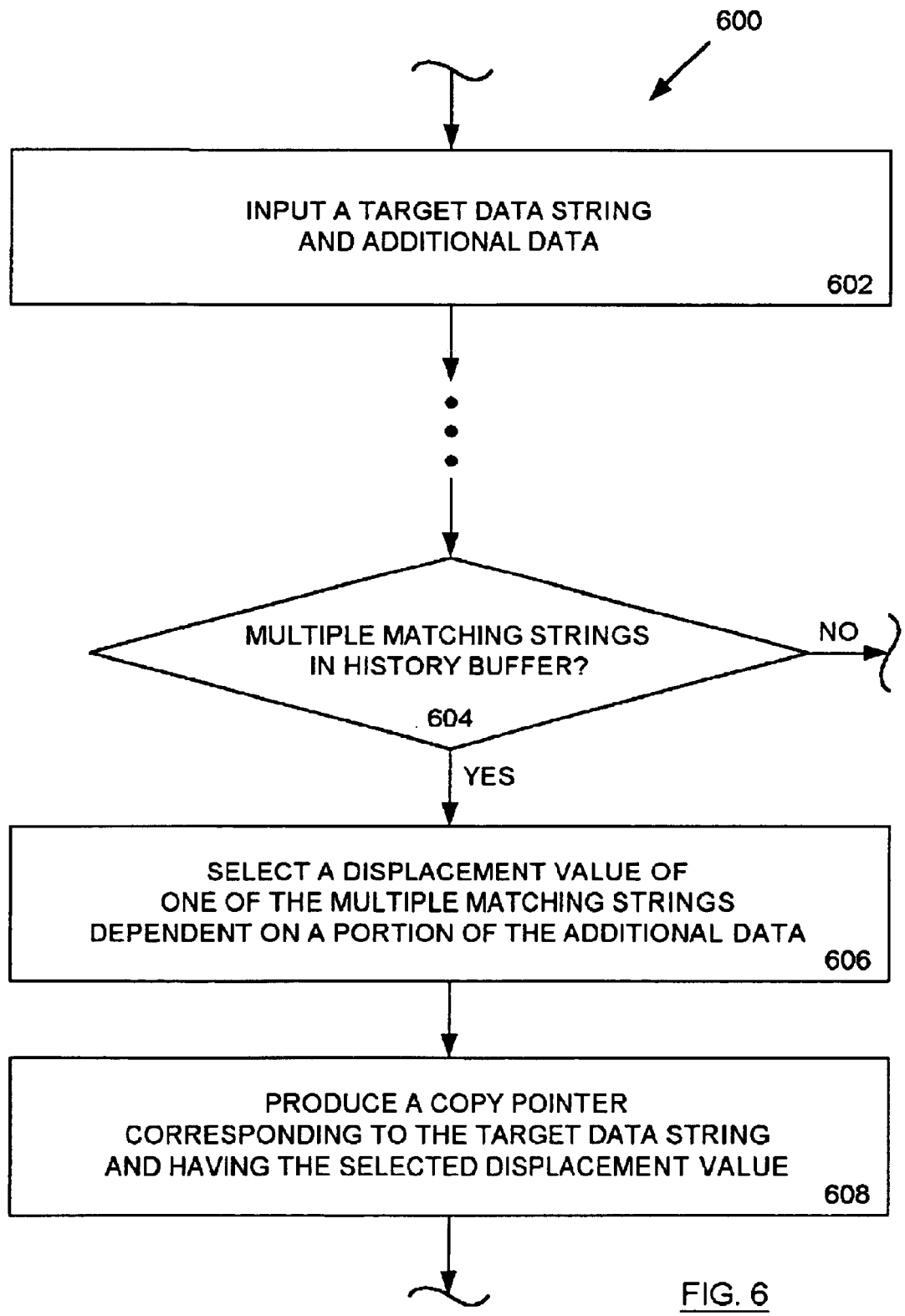
FIG. 6 is a flow chart of one embodiment of a method for compressing data.

FIG. 6 is a flow chart of one embodiment of a method 600 for compressing data. The method 600 may be utilized within the encoder 108 of the host 102 of FIG. 1. During an operation 602 of the method 600, a target data string and additional data are input (e.g., by an encoder). The target data string includes multiple target data units (e.g., target data bytes). Prior to a decision operation 604, a history buffer (e.g., of the encoder) may be searched for matching strings. If multiple matching strings of data units (e.g., data bytes) stored in the history buffer match the target data string during a decision operation 604, a displacement value of one of the multiple matching strings is selected during an operation 606 dependent on a portion of the additional data (e.g., values of one or more bits of the additional data).

For example, a portion of the additional data may be selected dependent upon a total number of the multiple matching strings in the history buffer, and a displacement value corresponding to one of the matching strings may be selected dependent on a value of the selected portion of the additional data. A copy pointer is produced during an operation 608 that corresponds to the target data string and includes the selected displacement value such that the selected displacement value conveys the portion of the additional data.

Figure 7:
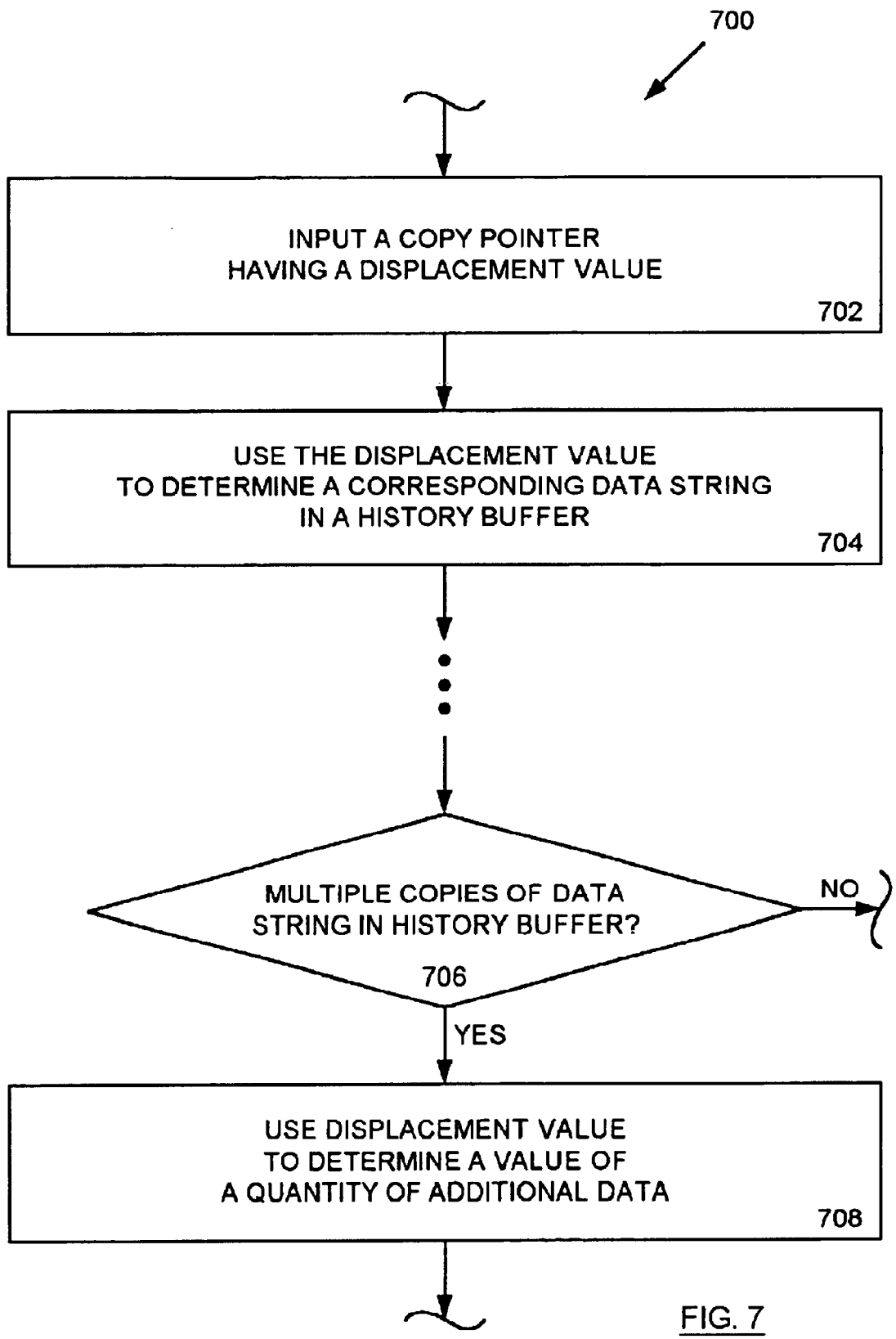
FIG. 7 is a flow chart of one embodiment of a method for decompressing data.

FIG. 7 is a flow chart of one embodiment of a method 700 for decompressing data. The method 700 may be utilized in the decoder 110 of the client 104 of FIG. 1. During an operation 702 of the method 700, a copy pointer having a displacement value is input (e.g., to a decoder). The displacement value is indicative of a location of a first data unit (e.g., a first data byte) of a data string in a history buffer (e.g., of the decoder). The displacement value is used to determine the data string during an operation 704. It is noted that the copy pointer typically also includes a count value, and the count value is typically used along with the displacement value to determine the data string during the operation 704. Prior to a decision operation 706, the history buffer may be searched for multiple copies of the data string. If multiple copies of the data string exist in the history buffer during the decision operation 706, the displacement value is used to determine a value of a quantity of additional data (e.g., values of one or more bits of additional data) conveyed by the displacement value during an operation 708.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An encoder for compressing data, comprising:
a history buffer comprising a plurality of storage locations for storing target data units;
wherein the encoder is configured to input a target data string comprising a plurality of target data units, and additional data;
wherein the encoder is configured to:
select a displacement value of one of a plurality of matching strings in the history buffer that match the target data string dependent on at least a portion of the additional data; and
produce a copy pointer corresponding to the target data string and comprising the selected displacement value such that the selected displacement value conveys the portion of the additional data.

2. The encoder as recited in claim 1, wherein the additional data comprises security data associated with the target data string.

3. The encoder as recited in claim 1, wherein the encoder implements a lossless data compression algorithm.

4. The encoder as recited in claim 1, wherein the encoder implements a data compression algorithm of the Lempel-Ziv 1 (LZ_1) class.

5. The encoder as recited in claim 1, wherein the selected displacement value is indicative of a location of a first target data unit of a corresponding matching string in the history buffer.

6. The encoder as recited in claim 1, wherein the selected displacement value comprises an address or storage location number of a first target data unit of a corresponding matching string in the history buffer.

7. The encoder as recited in claim 1, wherein the copy pointer comprises a count value indicative of a total number of target data units in a matching string corresponding to the selected displacement value.

8. The encoder as recited in claim 1, wherein the encoder is configured to input the target data string one target data unit at a time.

9. A decoder for decompressing data, comprising:
a history buffer comprising a plurality of storage locations for storing data units; and
wherein the decoder is configured to input a copy pointer comprising a displacement value indicative of a location of a first data unit of a data string in the history buffer, to use the displacement value to determine the data string, and to use the displacement value to determine a value of a quantity of additional data conveyed by the displacement value in the event multiple copies of the data string exist in the history buffer.

10. The decoder as recited in claim 9, wherein the additional data comprises security data associated with the data string.

11. The decoder as recited in claim 9, wherein the decoder implements a lossless data decompression algorithm.

12. The decoder as recited in claim 9, wherein the decoder implements a data decompression algorithm of the Lempel-Ziv 1 (LZ_1) class.

13. The decoder as recited in claim 9, wherein the displacement value comprises an address or storage location number of the first data unit of the data string in the history buffer.

14. The decoder as recited in claim 9, wherein the copy pointer comprises a count value indicative of a total number of data units in the data string in the history buffer, and wherein the decoder is configured to use the displacement value and the count value to determine the data string.

15. The decoder as recited in claim 9, wherein the decoder is configured to produce the data string one data unit at a time.

16. A system, comprising:
an encoder for compressing data, comprising a first history buffer having a plurality of storage locations for storing target data units;
a decoder for decompressing data, comprising a second history buffer substantially identical to the first history buffer;
wherein the encoder is configured to input a target data string comprising a plurality of target data units, and additional data;
wherein the encoder is configured to:
select a displacement value of one of a plurality of matching strings in the encoder history buffer that match the target data string dependent on a portion of the additional data; and
produce a copy pointer corresponding to the target data string and comprising the selected displacement value; and
wherein the decoder is coupled to receive the copy pointer and is configured to use the displacement value of the copy pointer to determine the portion of the additional data conveyed by the displacement value.

17. A method for compressing data, comprising:
inputting a target data string comprising a plurality of target data units, and additional data;
performing the following operations in the event multiple matching strings of data units stored in a history buffer match the target data string:
selecting a displacement value of one of the multiple matching strings dependent on a portion of the additional data; and
producing a copy pointer corresponding to the target data string and comprising the selected displacement value such that the displacement value conveys the portion of the additional data; and
storing data units in the history buffer.

18. The method as recited in claim 17, wherein the selecting comprises:
selecting a displacement value of one of the matching strings dependent on a value of a portion of the additional data.

19. The method as recited in claim 17, wherein the selecting step comprises:
selecting a portion of the additional data dependent upon a total number of the multiple matching strings; and
selecting a displacement value of one of the matching strings dependent on a value of the selected portion of the additional data.

20. A method for compressing data, comprising:
inputting a target data string comprising a plurality of target data units, and additional data;
searching a history buffer for matching strings of data units that match the target data string;
performing the following in the event multiple matching strings exist in the history buffer:
selecting a portion of the additional data dependent upon a total number of the multiple matching strings;
selecting a displacement value of one of the matching strings dependent on a value of the selected portion of the additional data; and
producing a copy pointer corresponding to the target data string and comprising a displacement value of the selected matching string such that the displacement value conveys the portion of the additional data; and
storing data units in the history buffer.

21. A method for decompressing data, comprising:
inputting a copy pointer comprising a displacement value indicative of a location of a first data unit of a data string in a history buffer;
using the displacement value to determine the data string; and
in the event multiple copies of the data string exist in the history buffer, using the displacement value to determine a value of a quantity of additional data conveyed by the displacement value.

22. A method for decompressing data, comprising:
inputting a copy pointer comprising a displacement value and a count value, wherein the displacement value is indicative of a location of a first data unit of a data string in a history buffer, and wherein the count value is indicative of a total number of data units in the data string;
determining the data string with reference to the displacement value and the count value;
identifying in the history buffer multiple copies of the data string;
determining, with reference to the total number of the multiple copies of the data string, a quantity of additional data conveyed by the displacement value; and
determining with reference to the displacement value, a value of the quantity of additional data conveyed by the displacement value.

23. A computer program product for compressing data the computer program product having a medium with a computer program embodied thereon, the computer program comprising:

computer program code for inputting a target data string comprising a plurality of target data units, and additional data;

computer program code for performing the following operations in the event multiple matching strings of data units stored in a history buffer match the target data string:

selecting a displacement value of one of the multiple matching strings dependent on a portion of the additional data; and producing a copy pointer corresponding to the target data string and comprising the selected displacement value such that the displacement value conveys the portion of the additional data; and computer program code for storing data units in the history buffer.

24. A computer program product for decompressing data the computer program product having a medium with a computer program embodied thereon, the computer program comprising:

computer program code for inputting a copy pointer comprising a displacement value indicative of a location of a first data unit of a data string in a history buffer;

computer program code for using the displacement value to determine the data string; and computer program code for, in the event multiple copies of the data string exist in the history buffer, using the displacement value to determine a value of a quantity of additional data conveyed by the displacement value.

* * * * *